United States Patent
Gerstenhaber et al.

(10) Patent No.: US 6,483,382 B1
(45) Date of Patent: Nov. 19, 2002

(54) CURRENT COMPENSATION CIRCUIT FOR IMPROVED OPEN-LOOP GAIN IN AN AMPLIFIER

(75) Inventors: Moshe Gerstenhaber, Newton, MA (US); Chau C. Tran, Malden, MA (US); Mark Fazio, Winchester, MA (US)

(73) Assignee: Analog Devices, Inc., Norwood, MA (US)

( * ) Notice: Subject to any disclaimer, the term of this patent is extended or adjusted under 35 U.S.C. 154(b) by 19 days.

(21) Appl. No.: 09/663,751

(22) Filed: Sep. 15, 2000

(51) Int. Cl.[7] .............................................. H03F 3/45
(52) U.S. Cl. ....................................... 330/252; 330/257
(58) Field of Search ................................. 330/255, 257, 330/292, 252

(56) References Cited

U.S. PATENT DOCUMENTS 5,670,910 A * 9/1997 Kato ........................ 330/257 X
6,046,642 A * 4/2000 Brayton et al. ............. 330/296
6,300,833 B1 * 10/2001 Vyne et al. ................. 330/257

* cited by examiner

Primary Examiner—Steven J. Mottola
(74) Attorney, Agent, or Firm—Samuels, Gauthier & Stevens, LLP

(57) ABSTRACT

A current compensation circuit for an amplifier, for example an operational amplifier, having input and output stages coupled at a high-impedance node, compensates for any modulation of current occurring at the high-impedance node. Particularly, the compensation circuit of the present invention reduces the error current at the high-impedance node resulting from a mismatch in beta between PNP and NPN transistors in the output stage, and reduces any error current resulting from the Early voltage effects of transistors in the output stage. In this manner, the present invention serves to substantially isolate the amplifier input stage from the output load, and from any beta mismatch or Early voltage effects in the transistors of the output stage, resulting in greatly improved open-loop gain.

17 Claims, 2 Drawing Sheets

CURRENT COMPENSATION CIRCUIT FOR IMPROVED OPEN-LOOP GAIN IN AN AMPLIFIER

BACKGROUND OF THE INVENTION

In contemporary operational amplifiers, isolation of the voltage of the input signals applied to the input ports from the load at the output port is a common goal, as is the goal of optimal gain. With reference to the example of Prior Art FIG. 1, first and second input signals are provided at input nodes inp, inm at the bases of first and second input transistors q1, q2 respectively. Current sources i2, i1 are coupled between a positive supply voltage VPLUS and the collectors of transistors q1, q2 respectively. The emitters of transistors q1, q2 are jointly coupled to a current source i5, in turn coupled to a negative supply voltage VMINUS. Collectively, the transistors q1, q2 and current sources i1, i2, and i5 comprise a transconductance stage 22 for the amplifier for converting voltage signals applied at the input nodes inp, inm to current signals at nodes N1, N2.

The output nodes N1, N2 of the transconductance stage are provided to the emitters of a folded cascode transistor pair 24, comprising first and second transistors q3, q4. The bases of the transistors q3, q4 are jointly coupled to a voltage source v1, in turn coupled to the positive supply voltage VPLUS, while the collectors are coupled to a current mirror 26. The current mirror 26 comprises transistors q6, q7, and q8, configured as shown, the emitters of which are coupled to resistors r6, r1 and r2 respectively. Collectively, the transconductance stage 22, the folded cascode pair 24, and current mirror 26 comprise an input stage 28, the output of which is provided at a high-impedance node N3. The resulting signal at the high-impedance node N3 represents the difference in current carried by transistors q1 and q2, which is, in turn, a function of the difference in voltage supplied by the first and second input signals at the input nodes inp, inm. The resulting signal at the high-impedance node N3 is provided to an output stage 30.

Output stage 30 includes a gain stage 32, a current source 34, and an output buffer 36. The gain stage 32 amplifies the signal provided at the high-impedance node N3. The current source 34 in combination with the current source i6 bias the transistors q10, q14 of the gain stage 32 to produce the voltage gain, resulting in an amplified difference signal at node N4. The output buffer 36 buffers the amplified difference signal at node N4 to produce a buffered output signal at the output node OUTPUT.

This configuration suffers from a number of limitations. For example, assuming the current provided by the current source 34 to be a constant current, and assuming a positive load current drawn by a load at the output node OUTPUT, the base current at transistor q17, for example comprising an NPN transistor, would be represented by the load current divided the beta, or gain, of transistor q17. Therefore, due to the positive load, the base current of transistor q17 is elevated, and, as a result, less current is provided to the collector of transistor q14. Consequently, it follows that less current is provided to the base of transistor q14, which results in less current drawn from the transistor q10 emitter, corresponding to less current being drawn from the base of transistor q10 at the high-impedance node N3.

Similarly, for a negative load current drawn at the OUTPUT node, transistor q16 becomes active, rather than transistor q17, and the base current at transistor q16, for example comprising an PNP transistor, is represented by the load current divided the beta of transistor q16. Due to the negative load, the base current of transistor q16 is elevated, and, following the explanation above, this corresponds to more current being drawn from the base of transistor q10 at the high-impedance node N3.

Any variance in the base current of q10 causes a corresponding change in the input voltages at the input nodes inp, inm that provide the q10 base current. This is an undesirable outcome, since an important function of the amplifier is the isolation of the input terminals from the load at the output terminals. This modulation of the current into the high-impedance node is referred to in the art and herein as an "error currents".

Additionally, during the fabrication process, it is difficult to generate PNP and NPN transistors having the same beta on a common integrated circuit. Since the output stage 36 NPN transistor q17 and PNP transistor q16 are likely to have different betas, their base currents are affected differently by the same load. This translates to a different effect on the high-impedance node N3, and, in turn, a modulation of the voltages at the input nodes inp, inm to different degrees, depending on whether the load is drawing a positive or negative current.

Furthermore, nearly all transistors are subject to a phenomenon referred to as the "Early effect", which represents a difference in current at the collector of a transistor for a given base-emitter voltage, as a function of the collector-emitter voltage. In the Prior Art configuration of FIG. 1, the Early voltage effects for output stage transistors q14 and q15 will likewise cause a variance in the base current of transistor q10 at the high-impedance node N3, in turn causing a modulation of the input voltages at input nodes inp, inm, as described above. In the present case of FIG. 1, changes to the transistor q14 collector current can occur as a function of the transistor q15 Early voltage effect, as well as changes to the transistor q14 base current (beta) as a function of transistor q14 Early voltage. Any variance in the transistor q14 collector current and beta will result in modulation of the transistor q14 and transistor q10 base currents, which ultimately modulates the input voltage of nodes inp and inm at the input stage 28, as described above.

SUMMARY OF THE INVENTION

The present invention is directed to a differential amplifier that addresses the limitations of the prior art. In doing so, the present invention provides an amplifier having greatly enhanced open-loop gain, while maintaining performance-characteristics.

Particularly, the present invention is directed to a current compensation stage for an amplifier, for example an operational amplifier, that compensates for any modulation of current occurring at the high-impedance node. Furthermore, the configuration of the present invention reduces the error current at the high-impedance node resulting from a mismatch in beta between PNP and NPN transistors in the output stage, and reduces any error current resulting from the Early voltage effects of transistors in the current source and gain stage of the output stage. In this manner, the present invention serves to substantially isolate the amplifier input stage from the output load, and from any beta mismatch or Early voltage effects in the transistors of the output stage.

In a first embodiment, the present invention is directed to an amplifier comprising an input stage and an output stage coupled at a high-impedance node, and a compensation circuit. The input stage generates a difference signal that is a function of the difference in voltage between first and second input signals applied to first and second input ports. The difference signal is provided at the high-impedance node. The output stage is coupled to the high-impedance node of the input stage, and includes an output circuit coupled to the high-impedance node. The compensation circuit is also coupled to the high-impedance node such that any error current drawn from the high impedance node by the output circuit is substantially minimized by the compensation circuit.

The difference signal may comprise a current signal and the first and second input signals may comprise voltage signals. The output circuit may comprise a voltage gain stage as well as an output buffer.

The voltage gain stage may comprise: a first transistor, a base of which is coupled to the high-impedance node, an emitter of which is coupled to a current source, and a collector of which is coupled to the compensation circuit; and a second transistor, a base of which is coupled to the emitter of the first transistor, an emitter of which is coupled to a negative voltage source, and a collector of which is coupled to an output stage of the output circuit.

The output circuit may include a first transistor having a base, emitter and collector, the base being coupled to the high-impedance node, the emitter being coupled to a gain stage of the output circuit. The compensation circuit may include a sense transistor cascoded to the collector of the first transistor for generating, at the base of the sense transistor, a compensation current substantially equal in magnitude to the error current. A current mirror transistor, a collector of which is coupled to the base of the first transistor at the high-impedance node, provides the compensation current to the high-impedance node. A bootstrapping transistor, a base of which being coupled to the emitter of the first transistor, and an emitter of which is coupled to an emitter of the current mirror transistor, bootstraps the voltage at the collector of the first transistor to the base of the first transistor, and bootstraps the voltage at the collector of the sense transistor to the voltage at the base of the first transistor.

The compensation circuit may further optionally include: a second transistor, an emitter of which is coupled to the collector of the sense transistor, a collector of which is coupled to a positive voltage source, and a base of which is coupled to a current source; a resistor, coupled between the base of the second transistor and the emitter of the current mirror transistor; and first and second diodes coupled between the emitter of the current mirror transistor, and the emitter of the bootstrapping transistor.

The first transistor, the sense transistor, and the second transistor may comprise NPN transistors, while the current mirror transistor and the bootstrapping transistor may comprise PNP transistors.

A current mirror, for example a Wilson-style current mirror, may also be coupled to the high-impedance node.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 2:
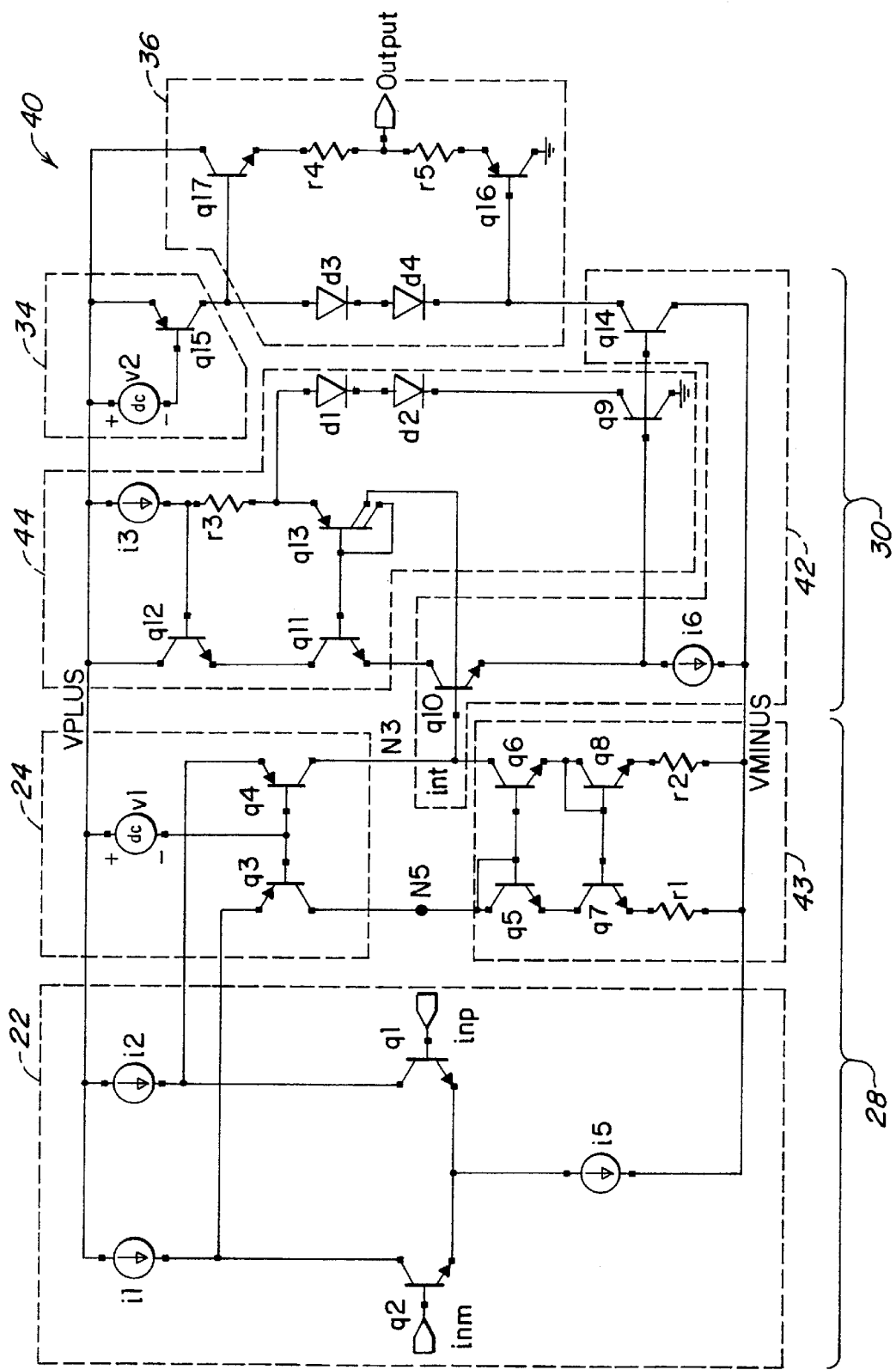
FIG. 2 is a schematic diagram of an operational amplifier including a current compensation circuit, in accordance with the present invention.

The schematic diagram of FIG. 2 illustrates an embodiment of the present invention including a current compensation circuit 44 that serves to isolate the amplifier input stage 28 from the output load, and from any beta mismatch or Early voltage effects in the transistors of the output stage 30. For the purpose of example, the present invention is embodied and described below as an operational amplifier. It will however be apparent to those skilled in the art that other amplifier embodiments are equally applicable to the present invention.

The operational amplifier 40 of the present invention includes an input stage 28 comprising a transconductance stage 22 and a folded cascode pair 24 in the same configuration as that described above with reference to Prior Art FIG. 1. The current mirror 43 of input stage 28 of the present invention may comprise a Wilson-type current mirror as shown in FIG. 2, which is widely used and understood in the art. Other current mirrors are equally applicable to the present invention, depending on the application, as will be described below. The output of the current mirror 43 at node N3 represents a high-impedance node at the output of the input stage 28.

The output stage 30 of the present invention, as in the Prior Art configuration above, includes a current source 34 and an output buffer 36. The gain stage 42 is modified to include a compensating circuit 44 coupled at the base, collector, and emitter of transistor q10.

The compensating circuit 44 serves to compensate for any variance in current that may occur at the base of transistor q10 due to a change in output load, due to beta mismatch in the output transistors q16, q17, or due to Early voltage effects in the output stage 30 transistors q14, q15. The compensating circuit is coupled to the high-impedance node N3 in parallel with transistor q10, and serves to emulate the behavior of transistor q10 by sensing, and compensating for, any current drawn by the base of transistor q10 at the high-impedance node N3. In doing so, the current supplied to the base of transistor q10 becomes nearly zero, and therefore, the gain of the amplifier is greatly enhanced.

To accomplish this, the compensating circuit 44 includes a sense transistor q11 that is cascode to the collector of transistor q10. As the sense amplifier, transistor q11 generates at its base an identical current to that generated at the base of transistor q10. To cause an accurate emulation of transistor q10, transistor q11 must be made to operate under substantially similar conditions as those of transistor q10. For this reason, transistor q12 is cascode to transistor q11, in order to make transistor q11 operate at the same collector-emitter voltage as transistor q10.

The compensating circuit further bootstraps the voltage of the collector of transistor q10 to the voltage of the base of transistor q10, by virtue of transistor q9, the voltage drop across the second and first diodes d2, d1, the base-to-emitter voltage drop of transistor q13, and the base-to-emitter voltage drop of transistor q11. Accordingly, when the voltage at the base of transistor q10 raises or lowers, so too does the voltage at the base of "sense" transistor q11.

The voltage at the collector of transistor q11 is likewise bootstrapped to the voltage of the base of transistor q10, by virtue of transistor q9, the voltage drop across the second and first diodes d2, d1, the base-to-emitter voltage drop of transistor q13, the base-to-emitter voltage drop of transistor q11, resistor r3, and the base-to-emitter voltage drop of transistor q12. The resistor r3 ensures that transistor q11 has the same collector-to-emitter voltage as that of transistor q10. Resistor r3 is provided because the base-to-emitter voltage of PNP transistor q13 is different than the voltage drop across diodes d1, d2, and the base-to-emitter voltage across NPN transistors q9, q10, and q11. Current source i3 serves to forward-bias transistor q9 and diodes d1 and d2.

Transistor q13 operates as a current mirror, the input of which is the base current from q11, and the output of which is a current equal and opposite that of the base current of transistor q10. The output current of transistor q13 is applied to the high-impedance node N3 to substantially cancel any base current at transistor q10, as described above.

In this manner, transistor q11 is, at all times, under the same operating conditions as transistor q10. Therefore, any variance in the current at the high-impedance node N3 at the base of transistor q10 is produced at the base of transistor q11, and an equal and opposite current is applied to high-impedance node by transistor q13. Accordingly, any condition causing a modulation of the current at the high-impedance node N3, whether it be due to a variance in the output load, a mismatch in beta of the output transistors, or Early effects in the transistors of the output stage, has no consequence at the high-impedance node N3, and therefore no consequence on the voltages applied at the input nodes inm, inp.

Figure 1:
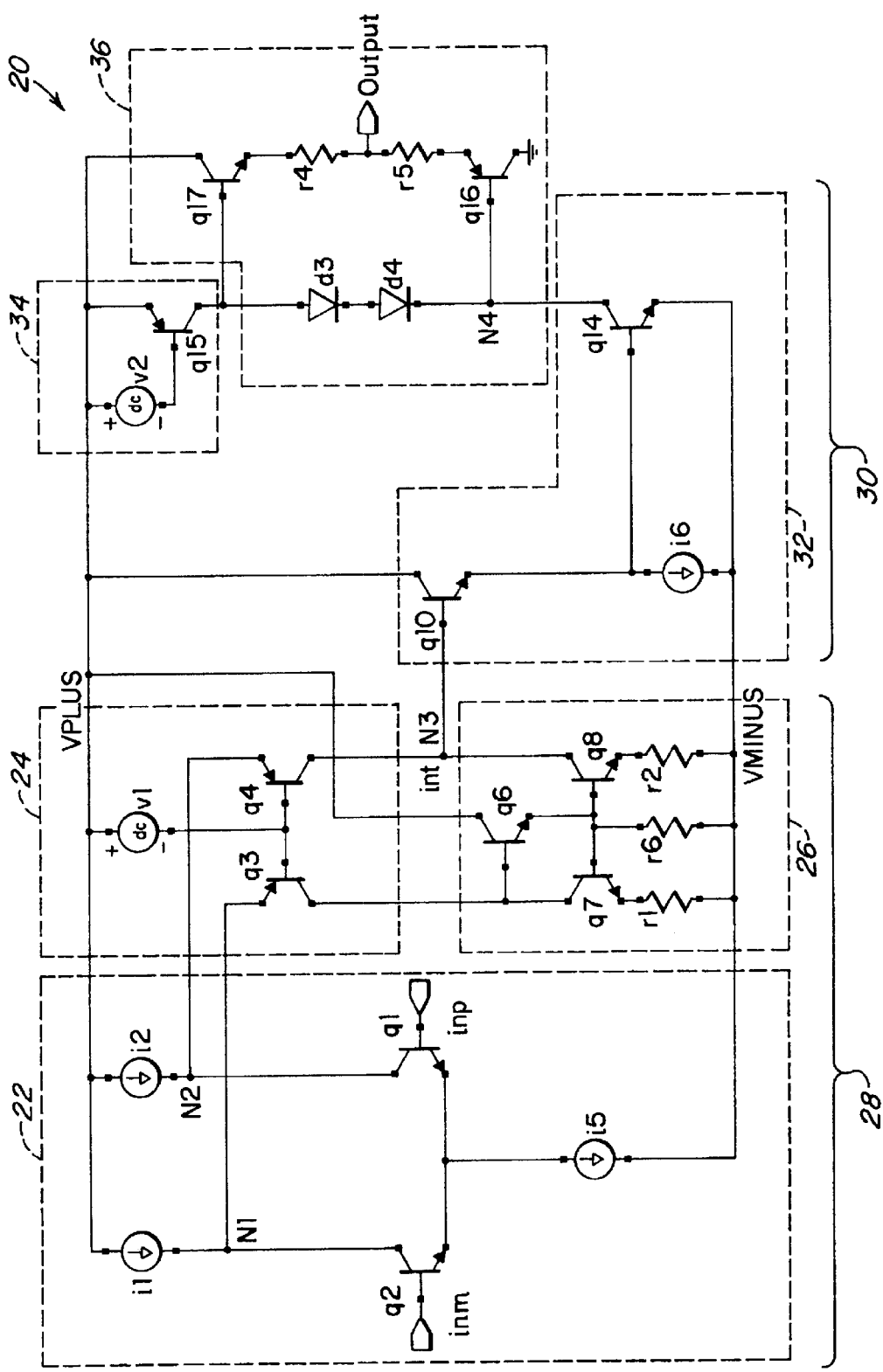
FIG. 1. is a schematic diagram of a conventional operational amplifier.

In the Prior Art configuration of FIG. 1, assuming that transistor q10 is biased correctly, then the base current of transistor q10 is the same as the base current of transistor q6. According to the present invention, no current is drawn from the base of transistor q10; therefore, no current is drawn from the other leg of the current mirror 43 at node N5. As stated above, the current mirror 43 of the input stage may comprise a Wilson-style current mirror 43. In the Wilson-style current mirror 43, the resistance values of resistors r1, r2 and the relative sizes and betas of transistors q5, q6, q7, q8, q10, and q14 are chosen to ensure that transistor q6 does not saturate, and so as to ensure that there is no error current introduced in to the input stage by the current mirror 43. Otherwise, although the resulting amplifier would have high gain, any current error would lead to drift and offset errors in the amplifier transfer function. In another optional embodiment, a standard current mirror may be employed, for example the current mirror 26 shown in FIG. 1, with a second compensation circuit 44 coupled to node N5, such that the base current at the high impedance node N3 is mirrored at node N5.

In a preferred embodiment, the resistance value of resistor r1 comprises 4 kΩ, r2 comprises 4 kΩ, r3 comprises 10 kΩ, r4 comprises 25 Ω, and r5 comprises 25 Ω. The current level generated by current source i1 comprises 30 µA, i2 comprises 30 µA, i3 comprises 40 µA, i5 comprises 20 µA, and i6 comprises 15 µA. The voltage level produced by voltage source v1 comprises 1.35V and voltage source v2 comprises a voltage suitable for driving 300 µA at the collector of transistor q15.

While this invention has been particularly shown and described with references to preferred embodiments thereof, it will be understood by those skilled in the art that various changes in form and details may be made therein without departing from the spirit and scope of the invention as defined by the appended claims.

We claim:

1. An amplifier comprising:
    an input stage for generating a difference signal that is a function of the difference in voltage between first and second input signals applied to first and second input ports, the difference signal being provided at a high-impedance node;
    an output stage coupled to the high-impedance node of the input stage, a the output stage including an output circuit, the output circuit being coupled to the high-impedance node; and
    an active compensation circuit coupled to the high-impedance node such that any error current drawn from the high impedance node by the output circuit is substantially minimized by the compensation circuit, wherein all transistors in the amplifier are bipolar type.

2. The amplifier of claim 1 wherein the difference signal comprises a current signal and wherein the first and second input signals comprise voltage signals.

3. The amplifier of claim 1 wherein the output circuit comprises a voltage gain stage.

4. The amplifier of claim 1 wherein the voltage gain stage comprises:
    a first transistor, a base of which is coupled to the high-impedance node, an emitter of which is coupled to a current source, and a collector of which is coupled to the compensation circuit; and
    a second transistor, a base of which is coupled to the emitter of the first transistor, an emitter of which is coupled to a negative voltage source, and a collector of which is coupled to an output stage of the output circuit.

5. The amplifier of claim 1 wherein the output circuit includes a first transistor having a base, emitter and collector, the base being coupled to the high-impedance node, the emitter being coupled to a gain stage of the output circuit, and wherein the compensation circuit comprises:
    a sense transistor cascoded to the collector of the first transistor for generating, at the base of the sense transistor, a compensation current substantially equal in magnitude to the error current;
    a current mirror transistor, a collector of which being coupled to the base of the first transistor at the high-impedance node, for providing the compensation current to the high-impedance node; and
    a bootstrapping transistor, a base of which being coupled to the emitter of the first transistor, and an emitter of which is coupled to an emitter of the current mirror transistor, for bootstrapping the voltage at the collector of the first transistor to the base of the first transistor, and for bootstrapping the voltage at the collector of the sense transistor to the voltage at the base of the first transistor.

6. The amplifier of claim 5 further comprising:
    a second transistor, an emitter of which being coupled to the collector of the sense transistor, a collector which being coupled to a positive voltage source, and a base of which is coupled to a current source;
    a resistor, coupled between the base of the second transistor and the emitter of the current mirror transistor; and
    first and second diodes coupled between the emitter of the current mirror transistor, and the emitter of the bootstrapping transistor.

7. The amplifier of claim 6 wherein the first transistor, the sense transistor, and the second transistor comprise NPN transistors, and wherein the current mirror transistor and the bootstrapping transistor comprise PNP transistors.

8. The amplifier of claim further comprising a current mirror coupled to the high-impedance node.

9. The amplifier of claim 8 wherein the current mirror comprises a Wilson-style current mirror.

10. An operational amplifier comprising:
   an input stage including a transconductance amplifier for generating a difference signal that is a function of the difference in voltage between first and second input signals applied to first and second input ports, the difference signal being provided at a high-impedance node;
   an output stage coupled to the high-impedance node, the output stage including a gain stage for amplifying the difference signal at the high impedance node to generate an amplified signal and an output buffer for buffering the amplified signal and providing the resulting buffered output signal at an output node; and
   an active compensation circuit coupled to the high-impedance node such that any variance in current drawn from the high-impedance node by the output stage is substantially minimized by the compensation circuit, wherein all transistors in the amplifier are bipolar type.

11. The operational amplifier of claim 10 wherein the difference signal comprises a current signal and wherein the first and second input signals comprise voltage signals.

12. The operational amplifier of claim 10 wherein the gain stage comprises:
   a first transistor, a base of which is coupled to the high-impedance node, an emitter of which is coupled to a current source, and a collector of which is coupled to the compensation circuit, a second transistor, a base of which is coupled to the emitter of the first transistor, an emitter of which is coupled to a negative voltage source, and a collector of which is coupled to the output buffer.

13. The operational amplifier of claim 10 wherein the output circuit includes a first transistor having a base, emitter and collector, the base being coupled to the high-impedance node, the emitter being coupled to a gain stage of the output circuit, and wherein the compensation circuit comprises:
   a sense transistor cascoded to the collector of the first transistor for generating, at the base of the sense transistor, a compensation current substantially equal in magnitude to the error current;
   a current mirror transistor, a collector of which being coupled to the base of the first transistor at the high-impedance node, for providing the compensation current to the high-impedance node; and
   a bootstrapping transistor, a base of which being coupled to the emitter of the first transistor, and an emitter of which is coupled to an emitter of the current mirror transistor, for bootstrapping the voltage at the collector of the first transistor to the base of the first transistor, and for bootstrapping the voltage at the collector of the sense transistor to the voltage at the base of the first transistor.

14. The operational amplifier of claim 13 further comprising:
   a second transistor, an emitter of which being coupled to the collector of the sense transistor, a collector which being coupled to a positive voltage source, and a base of which is coupled to a current source;
   a resistor, coupled between the base of the second transistor and the emitter of the current mirror transistor; and
   first and second diodes coupled between the emitter of the current mirror transistor, and the emitter of the bootstrapping transistor.

15. The operational amplifier of claim 14 wherein the first transistor, the sense transistor, and the second transistor comprise NPN transistors, and wherein the current mirror transistor and the bootstrapping transistor comprise PNP transistors.

16. The operational amplifier of claim 10 further comprising a current mirror coupled to the high-impedance node.

17. The operational amplifier of claim 16 wherein the current mirror comprises a Wilson-style current mirror.

* * * * *